United States Patent [19]

Atlas

[11] Patent Number: 4,653,794
[45] Date of Patent: Mar. 31, 1987

[54] UNIVERSAL ADJUSTABLE GRIPPER WITH CENTER PUSH

[75] Inventor: Michael Atlas, Arlington, Mass.

[73] Assignee: Northrop Corporation, Century City, Calif.

[21] Appl. No.: 828,615

[22] Filed: Feb. 12, 1986

[51] Int. Cl.[4] .............................................. B25J 15/08
[52] U.S. Cl. .................................... 294/88; 294/119.1; 901/37
[58] Field of Search .................... 294/86.4, 88, 119.1; 269/24, 25, 27, 30, 32, 156; 414/741, 744 A, 751; 901/31-37

[56] References Cited

U.S. PATENT DOCUMENTS

| | | | |
|---|---|---|---|
| 2,886,197 | 5/1959 | Harris | 294/88 X |
| 4,479,673 | 10/1984 | Inaba et al. | 294/119.1 X |
| 4,611,846 | 9/1986 | Feiber et al. | 294/119.1 X |

FOREIGN PATENT DOCUMENTS

| | | | |
|---|---|---|---|
| 2808967 | 9/1978 | Fed. Rep. of Germany | 294/88 |
| 18165 | 2/1978 | Japan | 294/119.1 |

Primary Examiner—Johnny D. Cherry
Attorney, Agent, or Firm—Kenway & Jenney

[57] ABSTRACT

A universal gripper particularly adapted for handling parts such as axial leaded electronic components. The gripper includes a pair of jaws with depending fingers mounted on a baseplate for linear motion equally about the centerline of the baseplate. A long stroke cylinder is mounted between the jaws and is adapted for opening and closing the gripping fingers through a relatively long stroke. A short stroke cylinder is affixed to one of the jaws and includes a yoke portion extending to the other jaw. Locking apparatus is provided for selectively locking the yoke portion to the other jaw. When the locking apparatus is activated, the short stroke cylinder opens and closes the fingers through a relatively short stroke. In this way, electronic components can be handled without crushing the leads. Because of the provision of the short stroke cylinder, the disclosed gripper can be used in tight areas. A center push cylinder is provided for ejecting parts from the gripping fingers.

5 Claims, 2 Drawing Figures

UNIVERSAL ADJUSTABLE GRIPPER WITH CENTER PUSH

BACKGROUND OF THE INVENTION

This invention relates to grippers, and more particularly to an adjustable gripper having both a relatively long and a relatively short stroke.

Automatic grippers are often used for the assembly of electronic circuits. In particular, grippers are known for inserting axial leaded devices such as resistors into printed circuit boards. In known gripping apparatus, the leads of such axial leaded electronic components may be crushed when a standard gripper is allowed to close on them. For this reason, standard grippers are not well suited for handling axial leaded electronic components. Furthermore, standard grippers often cannot operate in tight areas because of the standard gripper's excessive stroke length.

It is therefore an object of the present invention to provide gripping apparatus capable of handling axial leaded electronic components without crushing the leads.

It is a further object of the present invention to provide gripping apparatus which can be utilized where space is tight.

Still another object of the present invention is gripping apparatus which utilizes standard components and which is simple and easy to manufacture and use.

SUMMARY OF THE INVENTION

These and other objects of the invention are achieved by means of apparatus including a baseplate having a centerline and first and second jaws including depending first and second fingers. The jaws are mounted on the baseplate for linear motion equally about the centerline. A long stroke cylinder is mounted between the first and second jaws and is adapted for opening and closing the fingers through a relatively long stroke. A short stroke cylinder is affixed to the first jaw and has a yoke portion extending over the second jaw. The second jaw includes apparatus for selectively locking the yoke portion to the second jaw so that when the locking means is activated, the short stroke cylinder opens and closes the fingers through a relatively short stroke. In one embodiment, center push apparatus extends through the baseplate between the jaws and is adapted for ejecting objects gripped by the fingers.

BRIEF DESCRIPTION OF THE DRAWING

The present invention will be understood better with reference to the drawing of which.

DESCRIPTION OF THE PREFERRED EMBODIMENT

Figure 1:
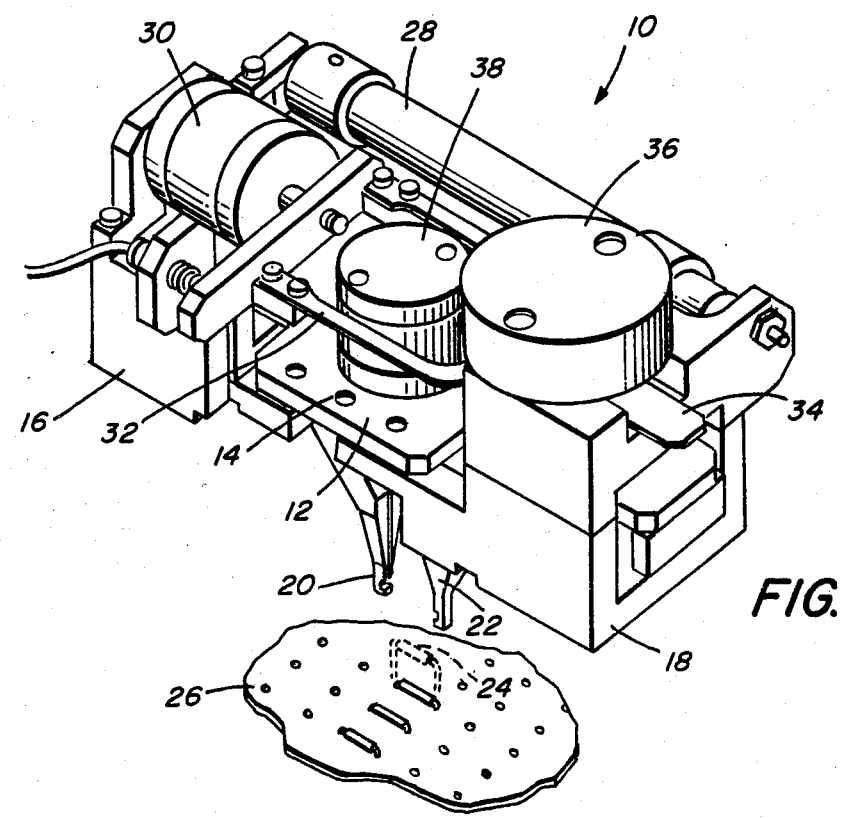
FIG. 1 is a perspective view of the apparatus disclosed herein.
Figure 2:
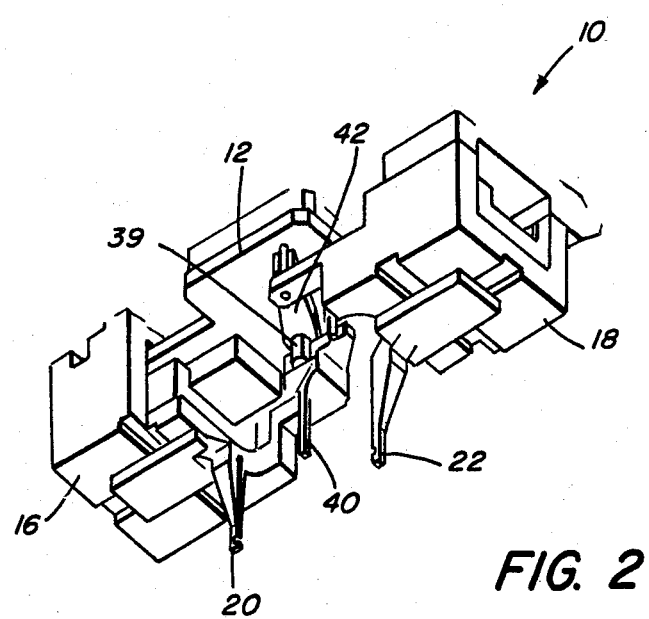
FIG. 2 is another perspective view of the disclosed apparatus.

With reference to FIGS. 1 and 2, the universal adjustable gripper 10 disclosed herein includes a baseplate 12 having a centerline position 14. First and second jaws 16 and 18 are mounted on the baseplate 12 for linear motion equally about the centerline 14. A finger 20 depends from the jaw 16 and a finger 22 depends from the jaw 18. The fingers 20 and 22 are adapted for gripping an electrical component such as a resistor 24 for insertion into an electronic board 26. A long stroke cylinder 28, preferably a pneumatic cylinder, extends between the jaws 16 and 18 and is adapted for opening and closing the fingers 20 and 22 through a relatively long stroke of approximately 1.5 inches. Those skilled in the art will appreciate that a source of pressurized gas (not shown) is provided to operate the pneumatic cylinders.

A short stroke cylinder 30, also preferably pneumatic, is rigidly mounted to the jaw 16. The piston portion of the cylinder 30 is connected to a yoke portion 32 which includes an end portion 34 extending beyond the jaw 18. A locking or brake cylinder 36 is affixed to the jaw 18 and, when activated, locks the end portion 34 of the yoke 32 with respect to the jaw 18.

A center push cylinder 38 with a piston shaft 39 has a depending finger 40 which is adapted to eject components gripped between the fingers 20 and 22 upon activation of the center push cylinder 38. FIG. 2 also shows the pivoted bell crank apparatus 42 which insures that the jaws 16 and 18 move equally about the centerline 14.

The operation of the apparatus 10 will now be described. First of all, the brake cylinder 36 is unlocked and the fingers 20 and 22 are opened to the full stroke of the long stroke cylinder 28. A reference object is provided whose size is equal to the desired closed dimension between the fingers 20 and 22, and the fingers 20 and 22 are closed around the reference object utilizing the long stroke cylinder 28. After the fingers 20 and 22 are closed around the reference object, the brake cylinder 36 is activated which locks the yoke 32 with respect to the jaw 18 by forcing the yoke 32 into tight contact with the jaw 18. When the brake cylinder 36 is activated, motion of the fingers 20 and 22 can be had only by activation of the short stroke cylinder 30. Thus, as the short stroke cylinder 30 is activated, the fingers 20 and 22 move through a short stroke adjustably up to 0.1 inches. Importantly, the fingers 20 and 22 will not close beyond the desired closed dimension between the fingers set in conjunction with the reference object thereby eliminating the potential for damage to the gripped component. Furthermore, since the stroke of the short stroke cylinder 30 is small, the fingers 20 and 22 will open only a small amount over the reference size allowing its use in tight areas. When it is desired to eject an object from the fingers 20 and 22, the center push cylinder 38 is activated which moves the finger 40 to eject a component or insert it into a circuit board.

When the gripper 10 is to be utilized for a different size component, the brake cylinder 36 is deactivated allowing the fingers 20 and 22 to be located around a new reference size. The brake cylinder 36 is then activated once again allowing objects of the new reference size to be gripped without damaging fragile leads.

It is thus seen that the objects of this invention have been achieved in that there has been disclosed gripping apparatus suitable for handling axial leaded electronic components without damage to the leads. The gripper is adjustable to accommodate various size components. It is recognized that modifications and variations of the present invention will occur to those skilled in the art and it is intended that all such modifications and variations be included within the scope of the appended claims.

What is claimed is:

1. Gripping apparatus comprising:
   a baseplate having a centerline;

first and second jaws including depending first and second fingers, the jaws mounted on the baseplate for linear motion equally about the centerline;

a long stroke cylinder mounted between the first and second jaws and adapted for opening and closing the fingers through a relatively long stroke;

a short stroke cylinder affixed to the first jaw, the short stroke cylinder including a yoke portion extending to the second jaw; and means mounted on the second jaw for selectively locking the yoke portion to the second jaw, whereby when the locking means is activated the short stroke cylinder opens and closes the fingers through a relatively short stroke.

2. The apparatus of claim 1 further including center push means extending through the baseplate between the jaws for ejecting objects gripped by the fingers.

3. The apparatus of claim 1 wherein the cylinders are pneumatically operated.

4. The apparatus of claim 1 wherein the relatively long stroke is approximately 1.5 inches and the relatively short stroke ranges up to 0.1 inches.

5. The apparatus of claim 1 including pivoted bell crank means adapted to insure that the jaws move equally about the centerline.

* * * * *